United States Patent [19]

Nitta et al.

[11] Patent Number: 4,731,699
[45] Date of Patent: Mar. 15, 1988

[54] MOUNTING STRUCTURE FOR A CHIP

[75] Inventors: Mitsuru Nitta; Tatsuo Inoue, both of Tokyo, Japan

[73] Assignee: NEC Corporation, Tokyo, Japan

[21] Appl. No.: 916,361

[22] Filed: Oct. 7, 1986

[30] Foreign Application Priority Data

Oct. 8, 1985 [JP] Japan ................................ 60-224488
Oct. 16, 1985 [JP] Japan ................................ 60-228869

[51] Int. Cl.$^4$ ............................................ H05K 7/20
[52] U.S. Cl. .................................... 361/386; 361/401; 361/418; 357/81
[58] Field of Search .............. 361/381, 386, 401, 418; 357/80, 81; 174/16 HS, 68.5; 428/901

[56] References Cited

U.S. PATENT DOCUMENTS

| | | | |
|---|---|---|---|
| 3,904,262 | 9/1975 | Cutchaw | 174/16 HS X |
| 4,341,432 | 7/1982 | Cutchaw | 174/16 HS X |
| 4,349,862 | 9/1982 | Bajorek et al. | 174/68.5 X |
| 4,498,120 | 2/1985 | Kaufman | 174/16 HS X |
| 4,541,035 | 9/1985 | Carlson et al. | 174/68.5 X |
| 4,578,304 | 3/1986 | Hamaguchi | 428/901 X |
| 4,630,172 | 12/1986 | Stenerson et al. | 361/386 |

FOREIGN PATENT DOCUMENTS 17474 1/1982 Japan .

OTHER PUBLICATIONS

Erickson, "Chip Carriers: Coming Force in Packaging", Electronic Packaging and Production, Jun. 1981, at 64–80.

Stafford, "Chip Carriers—Their Application and Future Direction", 4, IEEE Transactions on Components, Hybrids, and Manufacturing Technology, 195 (1981).

Primary Examiner—A. D. Pellinen
Assistant Examiner—Derek S. Jennings
Attorney, Agent, or Firm—Burns, Doane, Swecker & Mathis

[57] ABSTRACT

A mounting structure for a chip has a substrate having electrodes on an upper surface, terminals on a lower surface, and wirings to connect the electrodes and the terminals inside the substrate, pins on the upper surface of the substrate, and an integrated circuit chip with flexible lead terminals, which are interconnected to the electrodes, around a lower surface, and a heat radiation plate having openings in which the pins are received in one-to-one correspondence. The plate makes contact with an upper surface of the chip by a good heat-conductive material and is fixed to the pins by an adhesive. The substrate may be a multilayer ceramic section having wirings whose major component is gold; the ceramic section may be made of an inorganic composition which can be sintered in air at a temperature of less than 1400° C.

5 Claims, 2 Drawing Figures

MOUNTING STRUCTURE FOR A CHIP

BACKGROUND OF THE INVENTION

The present invention relates to a structure for mounting an integrated circuit (IC) chip.

Examples of conventional chip mounting structures are disclosed in a paper entitled "Chip carriers: coming force in packaging" by Dallas Erickson, published in March 1981 in the Electronic Packaging and Production, pp. 64 to 80, and a paper entitled "Chip Carriers—Their Application and Future Direction" by J. W. Stafford, published in June 1981 in the IEEE TRANSACTIONS ON COMPONENTS, HYBRIDS, AND MANUFACTURING TECHNOLOGY, VOL. CHMT-4, NO. 2, pp. 195 to 199.

In the conventional structures described, most of the heat generated in a chip is radiated towards the outside through a ceramic substrate on which the chip is mounted. The amount of heat radiation is, therefore, limited by the material and the configuration of the substrate, the contact area between the chip and the substrate, and other factors, so that power consumption of the chip mounted on the substrate is restricted to 1 to 2 watts at maximum. However, some high performance chips which have been developed recently to promote integration and fast operations consume power of several watts or more and, moreover, chips which consume power of even several tens of watts are expected to appear in the near future. Should such a high performance and great power consumption type chip be mounted by the conventional mounting structures, the temperature of the chip would be elevated to degrade reliability of operation and even burn the circuits built in the chip. Meanwhile, the ceramic substrate has heretofore been implemented with alumina. This brings about another problem that because the sintering temperature of alumina is higher than 1400° C. (degree centigrade), gold and other metals whose melting point and resistance are low cannot be used as a wiring material forming wirings within the substrate.

SUMMARY OF THE INVENTION

An object of the invention is, therefore, to provide a mounting structure for a chip free from the above-mentioned disadvantages in the conventional structures.

According to an aspect of the invention, there is provided a mounting structure for a chip which includes: a substrate having electrodes on an upper surface thereof, terminals on a lower surface thereof, and wirings for electrically interconnecting the electrodes and the terminals inside the substrate; pins mounted on the upper surface of the substrate; an integrated circuit chip with flexible lead terminals, which are interconnected to the electrodes, around a lower surface of the chip; and a heat radiation plate having openings in which the pins are received in one-to-one correspondence, making contact with an upper surface of the chip through a good heat-conductive material and being fixed to the pins by an adhesive.

BRIEF DESCRIPTION OF THE DRAWINGS

Other features and advantages of the invention will become more apparent from the following description when taken in conjunction with the accompanying drawings in which.

In the drawings, the same reference numerals represent the same structural elements.

DETAILED DESCRIPTION OF THE PREFERRED EMBODIMENT

Figure 1:
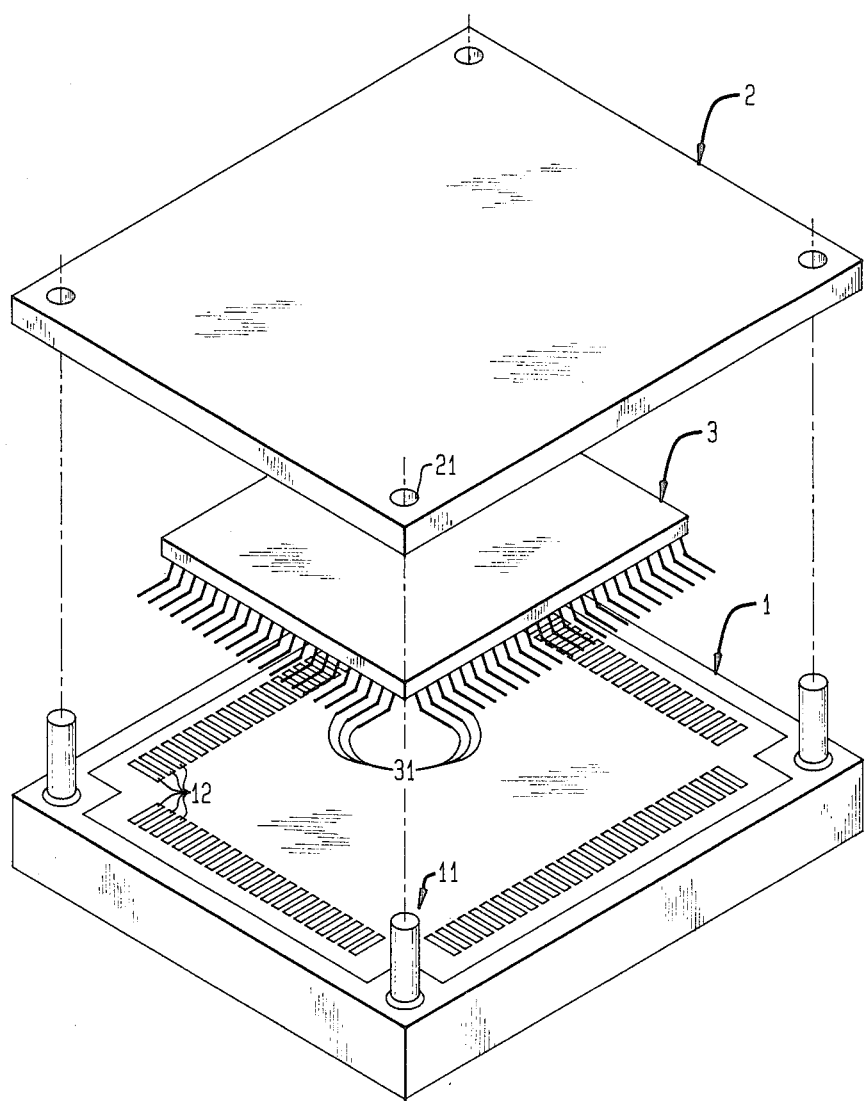
FIG. 1 is an exploded perspective view of an embodiment of the invention.

Referring to FIG. 1, an embodiment of the invention includes a multilayer wiring substrate 1 which serves as a carrier body of a chip carrier, four pins 11 extending upward at four corners on the upper surface of the substrate 1 on which a chip 3 and bonding electrodes 12 are provided, terminals (not shown) for connection with external circuits (not shown) provided on the lower surface of the substrate 1 opposite to the upper surface, and a heat radiation plate 2 formed with openings 21 that are respectively aligned with the four pins 11 on the substrate 1. The chip 3 has electronic circuits built thereinside and lead terminals 31 electrically interconnected to the electronic circuits.

The structure described above is assembled as follows. The procedure begins with mounting the chip 3 onto the upper surface of the substrate 1 and, then, bonding the terminals 31 to the bonding electrodes 12. This is followed by mounting the heat radiation plate 2 onto the subassembly of the substrate 1 and the chip 3 while inserting the pins 11 into the openings 21. At this instant, a heat-conductive material such as solder, heat-conductive adhesive or heat-conductive compound is supplied to between the plate 2 and the upper surface of the chip 3 so as to bond them together. Further, the pins 11 and the walls of the openings 21 are rigidly connected together by an adhesive.

Because the openings 21 of the plate 2 are fixed to the pins 11 of the substrate 1 as stated above, the chip 3 is prevented from coming off the substrate 1 when an external force is applied horizontally to the plate 2. In addition, even if a heat sink or like heavy element is mounted on the plate 2, the plate 2 rigidly connected to the pins 11 safeguards the chip 3 against breakage.

Further, because the plate 2 and the chip 3 are bonded together by the heat-conductive material directly and tightly over a wide area, heat generated in the chip 3 is readily transferred to the plate 2 by way of the heat-conductive material. This remarkably enhances heat radiation and, therefore, allows a chip consuming large amounts of power to be mounted on the substrate 1.

Figure 2:
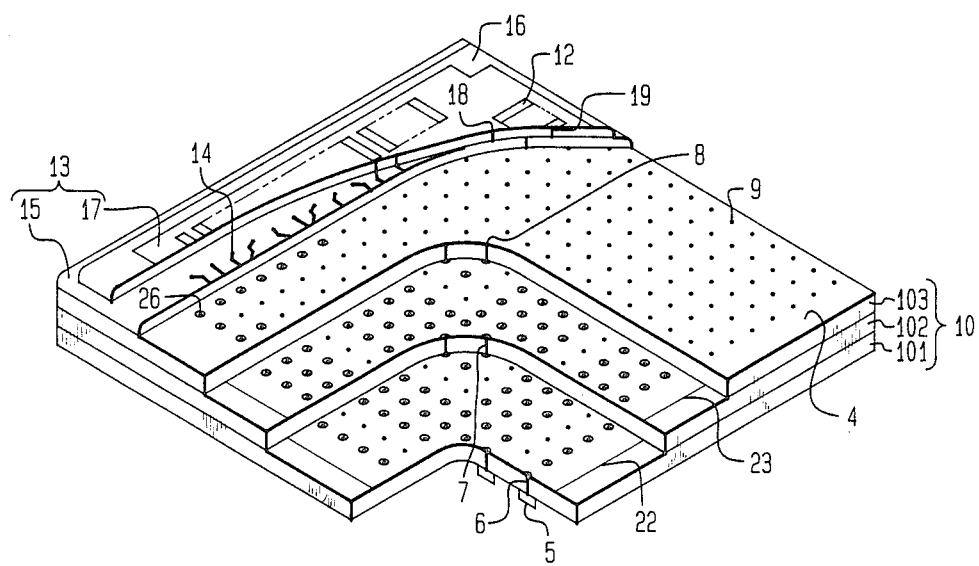
FIG. 2 is a perspective view of a substrate used in the embodiment.

Referring to FIG. 2, the substrate 1 applicable to the embodiment is composed of a multilayer ceramic substrate section 10 and a thin-film-multilayer-wiring section 13.

A method of producing the substrate 1 used in the embodiment will be described in detail. As shown in FIG. 2, the section 10 comprises three green sheets 101, 102 and 103 made of an inorganic composition capable of being sintered in air at a temperature lower than 1400° C., e.g. those disclosed in the Japanese Patent Application Disclosure No. 17474/1982. The green sheets 101, 102 and 103 are respectively formed with through-holes 6, 7 and 8 at predetermined positions thereof. Thick-film-conductive paste whose major component is gold is filled in the through-holes 6, 7 and 8 by printing. Power supply source wiring layers 22 and 23 are respectively printed on the surfaces of the green sheets 101 and 102 by use of the above-mentioned thickfilm-conductive paste. The green sheets 101, 102 and 103 are sequentially laid one upon another in alignment, then pressed to be bonded to each other, and then sintered in air at 700° C. to 900° C. to produce the section 10. Specifically, by such a sintering process, the green sheets 101, 102 and 103 are joined with each other while, at the same time, the conductive paste is burned to provide the wiring layers 22 and 23 and the through-hole wirings 6, 7 and 8, thereby setting up electrical connections inside the section 10.

In the section 10 manufactured by the above procedure, parts 9 of the through-hole wirings 8 exposed on the surface 4 of the section 10 have a noticeable degree of undulation. After the sintering process, therefore, the surface 4 of the section 10 is smoothed by polishing. Subsequently, the section 13 is formed by the following procedure. Specifically, it is usually impractical that the exposed parts 9 of the through-hole wirings 8 be in exact alignment with a designed position since the section 10 undergoes various rates of contraction during the sintering process. In light of this, cover lands 26 are formed on the surface 4 of the section 10 to absorb the positional errors. The cover lands 26, which are gold-plated films implemented with an selective plating method, are each dimensioned large enough to accommodate the maximum possible offset of the position of each of the exposed parts 9. Thereafter, photo-sensitive inorganic insulating paste is printed in such a manner as to cover the lands 26 and the surface 4. This paste is exposed to light, then developed, and then sintered in air at 900° C. to become an insulating layer 15. Through holes formed in the insulating layer 15 by the exposure and development process are filled with conductive paste whose major component is gold. The paste is then sintered to produce through-hole wirings 18.

Next, a 500-angstrom-thick titanium film and a 1000-angstrom-thick palladium film are sequentially deposited by magnetron-sputtering on substantially the whole area of the upper surface of the insulating layer 15, thereby forming a sputtered film. The sputtered film is covered with photoresist, then exposed to light and developed to produce openings in a desired wiring pattern. This is followed by depositing by electrolytic-plating a 5-micrometer-thick gold-plated film on those portions of the sputtered film which are exposed through the openings, thereby forming wiring patterns 14. Before the sputtered film is burned, the respective wiring patterns 14 remain short-circuited with each other. The technology heretofore available for such individual patterns 14 to be separated from each other has been a chemical etching process. Etching is undesirable, however, since it causes side etching to occur. In the embodiment, the individual wiring patterns 14 are isolated from each other not by etching but by burning the sputtered film in air at 900° C. to change it into an insulator by oxidation. Specifically, the portions of sputtered film located just beneath the wiring patterns 14 cannot turn into an insulator due to mutual diffusion of gold and palladium and titanium, that is, only the other portions turn into an insulator when burned. This allows the individual wiring patterns 14 to become independent of each other with the through-hole wirings 18 and the wiring patters 14 held in electrical interconnection. It will be apparent that the photoresist is also removed by the burning process.

Thereafter, the photosensitive inorganic insulating paste is printed to cover the wiring patterns 14 and the sputtered film in the same manner as described above, thereby forming an insulating layer 17 having through-hole wirings 19. This is followed by providing on the surface of the insulating layer 17 a sputtered film consisting of titanium and palladium. Then, wiring patterns 16 made of a gold-plated film are formed on the sputtered film. The individual wiring patterns 16 are made independent of each other by burning the sputtered film. It is to be noted that the thicknesses of and the processes for forming those sputtered film and gold-plated film are exactly the same as in the case of the wiring patterns 14. Finally, input/output terminals 5 are formed on the lower surface of the section 10.

As described above, in the embodiment, all the wirings are formed by use of the conductive paste whose major component is gold, so that the wiring resistance is lowered. The wiring patterns 14 and 16 are minute and free from side etching since they do not undergo any etching process. Further, the through-holes which are as small as ¼ to 1/5 of those formed by the screen-printing technology are achievable. These effects in combination contribute a great deal to the achievement of high-density wirings.

In summary, it will be seen that the invention provides power supply source wiring layers and through-hole wirings which can be implemented with a metal having a low melting point and a low resistance, e.g., gold so as to cut down wiring resistance, since the multilayer ceramic substrate including those wiring layers and wirings is constituted by an inorganic composition capable of being sintered in air at a temperature lower than 1400° C. Concerning the wiring patterns 14 and 16, they are formed without any etching process and, therefore, free from side etching and minute. Further, because through-holes are implemented with a photosensitive inorganic insulating paste, they are finer in dimension than those heretofore available, facilitating high-density wiring.

While the invention has been described in conjunction with the embodiment thereof, it will now readily be possible for those skilled in the art to put the invention into practice in various other manners.

What is claimed is:

1. A mounting structure for a chip comprising:
   a substrate having a plurality of electrodes on an upper surface thereof, a plurality of terminals on a lower surface thereof, and wirings for electrically interconnecting said electrodes and said terminals thereinside;
   a plurality of pins provided on said upper surface of said substrate;
   an integrated circuit chip provided with a plurality of flexible lead terminals, which are interconnected to said electrodes, around a lower surface of said chip; and
   a heat radiation plate having a plurality of openings in which said pins are received in one-to-one correspondence, making contact with an upper surface of said chip through a good heat-conductive material and being fixed to said pins by an adhesive.

2. A mounting structure for a chip as claimed in claim 1, wherein said substrate comprises:
   a multilayer ceramic section having thereinside wirings whose major component is gold and being constituted by an inorganic composition which is able to be sintered in air at a temperature lower than 1400° C.; and
   a thin-film-multilayer-wiring section having multiple layers provided on said ceramic section.

3. A mounting structure for a chip as claimed in claim 2, wherein each layer of said thin-film-multilayer wiring section comprises a plurality of layers, each one of which comprises:

a lower layer, of an insulating material provided with through-holes filled with a conductive paste whose major component is gold;

a sputtered film, provided on said lower layer; and a plurality of wiring patterns, whose major component is gold, provided on said sputtered film.

4. A mounting structure for a chip as claimed in claim 3, wherein said sputtered film is composed of titanium and palladium.

5. A mounting structure for a chip as claimed in claim 3, wherein said wiring patterns have been electrically isolated from one another, within each one of said plurality of layers, by burning said sputtered film in air.

* * * * *